US010615832B2

(12) United States Patent
Kollmann et al.

(10) Patent No.: US 10,615,832 B2
(45) Date of Patent: Apr. 7, 2020

(54) RF TRANSCEIVER WITH TEST CAPABILITY

(71) Applicant: Infineon Technologies AG, Neubiberg (DE)

(72) Inventors: Helmut Kollmann, Linz (AT); Jochen O. Schrattenecker, Reichenthal (AT); Florian Starzer, Ennsdorf bei Enns (AT)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 16/270,181

(22) Filed: Feb. 7, 2019

(65) Prior Publication Data
US 2019/0181902 A1    Jun. 13, 2019

Related U.S. Application Data

(63) Continuation of application No. 15/836,022, filed on Dec. 8, 2017, now Pat. No. 10,284,248.

(30) Foreign Application Priority Data

Dec. 20, 2016  (DE) .......................... 10 2016 125048
Aug. 22, 2017  (DE) .......................... 10 2017 119212

(51) Int. Cl.
*H04L 5/16*      (2006.01)
*H04B 1/3822*    (2015.01)
(Continued)

(52) U.S. Cl.
CPC ............ *H04B 1/3822* (2013.01); *G01S 7/032* (2013.01); *G01S 7/4056* (2013.01); *H01L 23/66* (2013.01);
(Continued)

(58) Field of Classification Search
CPC ........ H04B 1/40; H04B 3/23; H04B 17/0085; H04B 17/29; H04B 1/302; H03F 1/3211; H03F 1/3223
(Continued)

(56) References Cited

U.S. PATENT DOCUMENTS 8,593,219 B1 *  11/2013  Root .................... H03F 1/0288
                                        330/124 R
8,831,076 B2 *   9/2014  Yen .......................... H04B 1/30
                                        375/221
(Continued)

FOREIGN PATENT DOCUMENTS

CN      101517908 A    8/2009
CN      204681375 U    9/2015
CN      105510766 A    4/2016

*Primary Examiner* — Khai Tran
(74) *Attorney, Agent, or Firm* — Design IP

(57) ABSTRACT

An RF front-end circuit of an RF transceiver is described herein. In accordance with one exemplary embodiment, the fronted circuit includes a local oscillator (LO) configured to generate an RF transmit signal, an RF output port coupled to the local oscillator, wherein the RF transmit signal is output at the RF output port, and a monitoring circuit receiving an input signal and configured to determine the phase of the input signal or the power of the input signal or both. A directional coupler is coupled to the RF output port and configured to direct a reflected signal incoming at the RF output port as input signal to the monitoring circuit, and a controller is configured to detect, based on the determined phase or power or both, a defect in a signal path operably connected to the RF output port.

20 Claims, 5 Drawing Sheets

(51) Int. Cl.
  *H01L 23/66* (2006.01)
  *H01P 5/12* (2006.01)
  *G01S 7/03* (2006.01)
  *G01S 7/40* (2006.01)
  *H04B 17/17* (2015.01)
  *H04W 24/02* (2009.01)
  *G01S 13/931* (2020.01)

(52) U.S. Cl.
  CPC ............... *H01P 5/12* (2013.01); *H04B 17/17* (2015.01); *G01S 13/931* (2013.01); *G01S 2007/4069* (2013.01); *H01L 2224/16225* (2013.01); *H01L 2924/1423* (2013.01); *H04W 24/02* (2013.01)

(58) Field of Classification Search
  USPC .......... 375/219, 296, 346; 342/200; 332/102
  See application file for complete search history.

(56) References Cited

U.S. PATENT DOCUMENTS

| | | | |
|---|---|---|---|
| 10,284,248 B2* | 5/2019 | Kollmann | ............... G01S 7/032 |
| 2002/0024398 A1 | 2/2002 | Lagerblom et al. | |
| 2007/0165745 A1 | 7/2007 | Fonden et al. | |
| 2008/0079547 A1 | 4/2008 | Alicot et al. | |
| 2012/0088464 A1 | 4/2012 | Dehlink et al. | |
| 2012/0219090 A1* | 8/2012 | Youtz | .................. H04B 1/0475 |
| | | | 375/296 |
| 2012/0258675 A1 | 10/2012 | Itkin | |

* cited by examiner

RF TRANSCEIVER WITH TEST CAPABILITY

CROSS-REFERENCE TO RELATED APPLICATIONS

This application is a continuation of U.S. patent application Ser. No. 15/836,022, filed Dec. 8, 2017, which claims the benefit of German Patent Application No. 102016125048.1 filed Dec. 20, 2016 and German Patent Application No. 102017119212.3 filed Aug. 22, 2017, which are incorporated by reference as if fully set forth.

FIELD

The present disclosure relates to the field of RF transceivers, in general, and in particular to radar sensor systems and devices. For example, the present disclosure relates to an RF transceiver with test capability for detecting a defect or mismatch in the RF signal path.

BACKGROUND

Radio frequency (RF) transceivers and receivers can be found in numerous applications, particularly in the field of wireless communications and radar sensors. In the automotive sector, there is an increasing demand for radar sensors used in so-called "adaptive cruise control" (ACC) or "radar cruise control" (RCC) systems. Such systems may be used, for example, to automatically adjust the speed of an automobile so as to maintain a safe distance from other automobiles or other objects ahead.

Modern radar systems make use of highly integrated RF circuits, which may incorporate all core functions of an RF front-end of a radar transceiver in one single package (single chip transceiver). Such RF front-ends may include, inter alia, a voltage controlled oscillator (VCO), amplifiers such as power amplifiers and low noise amplifiers (LNAs), mixers, and directional couplers. Furthermore, the single chip transceiver may include circuit components for analog base band signal processing and an analog-to-digital converter (ADC) for subsequent digital signal processing. As mentioned, the RF frond-end as well as the base band signal processing may be integrated in a single chip also referred to as monolithic microwave integrated circuit (MMIC).

Radar applications used in automobiles are subject to various standards concerning road traffic safety, for example the functional safety standard ISO 26262 entitled "Road vehicles—Functional safety". To ensure the functional safety of a radar sensor, it is important to know whether the current state of the radar sensor allows a e.g., reliable distance and speed measurement. However, also in applications different from radar, reliability may be an issue. With regard to reliability of the radar measurements, one issue is impedance matching, e.g., establishing matched impedances of the output port of the RF front-end and the antenna. Any defect in the RF transmission line between the MMIC and the antenna may deteriorate the impedance matching and cause reflections. Furthermore, any object close to the antenna which obstructs radiation from the antenna, may deteriorate the impedance matching.

SUMMARY

An RF front-end circuit of an RF transceiver is described herein. In accordance with one exemplary embodiment, the fronted circuit includes a local oscillator (LO) configured to generate an RF transmit signal, an RF output port coupled to the local oscillator, wherein the RF transmit signal is output at the RF output port, and a monitoring circuit receiving an input signal and configured to determine the phase of the input signal or the power of the input signal or both. A directional coupler is coupled to the RF output port and configured to direct a reflected signal incoming at the RF output port as input signal to the monitoring circuit, and a controller is configured to detect, based on the determined phase or power or both, a defect in a signal path operably connected to the RF output port.

In accordance with another exemplary embodiment, the fronted circuit includes an RF output port configured to output an RF transmit signal, and a modulator configured to impose an adjustable phase shift on the RF transmit signal. A monitoring circuit receives an input signal and is configured to determine the phase of the input signal or the phase and power of the input signal. A directional coupler is coupled to the RF output port and configured to direct a reflected signal incoming at the RF output port as input signal to the monitoring circuit, and a controller is configured to tune the phase shift used by the modulator such that the phase determined by the monitoring circuit matches with a defined desired phase.

Furthermore, a self-test method for an RF front-end integrated in a monolithic microwave integrated circuit (MMIC) is described. In accordance with one exemplary embodiment, the method includes: generating an RF transmit signal; feeding the RF transmit signal to a signal path which is operably connected to an RF output port of the MMIC; and analyzing a reflected signal, which is reflected back to the RF output port of the MMIC to determine a phase of the reflected signal, a power of the reflected signal or both.

BRIEF DESCRIPTION OF THE DRAWINGS

The invention can be better understood with reference to the following drawings and descriptions. The components in the figures are not necessarily to scale; in-stead emphasis is placed upon illustrating the principles of the invention. Moreover, in the figures, like reference numerals designate corresponding parts. In the drawings.

DETAILED DESCRIPTION

Embodiments of the present invention are discussed below in the context of a radar transceiver. It should be noted, however, that the present invention may also be applied in applications different from radar such as, for example, RF transceivers of RF communication devices.

A so-called "single chip radar" may include circuitry providing the core RF functions needed for, e.g., distance and/or velocity measurement in one chip. Further, the direction of arrival (angle of incidence of the back-scattered signal) may be measured. Thus the chip may include, inter alia, RF front-end circuitry such as RF oscillators, amplifiers, and mixers, and base-band (or intermediate frequency (IF) band) circuitry such as amplifiers and analog filters. Additionally, an ADC may be included in the chip to digitize the base band or IF-band signal. In future sensor designs, also a digital signal processor may be included in the chip together with the ADC, the base band circuitry and the RF front-end circuitry. However, in today's radar sensors, a signal processor is usually implemented in a separate chip. The chip including the RF front-end is usually referred to as monolithic microwave integrated circuit (MMIC), which may be packed using any chip package suitable for RF applications. For example, the MMIC may be packed in an enhanced Wafer Level Ball Grid Array (eWLB) package. It is understood that other types of chip packages are also applicable.

Figure 1:
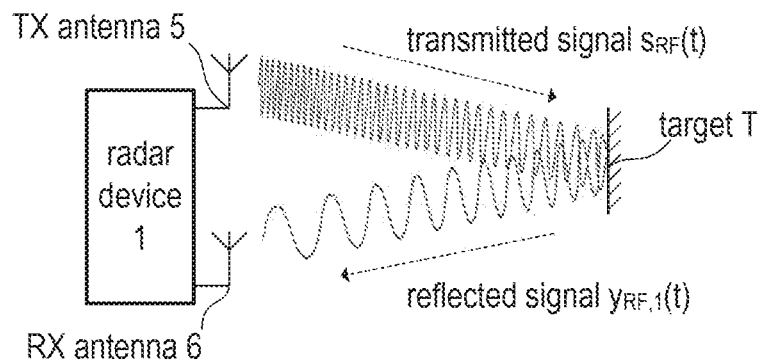
FIG. 1 illustrates an operating principle of a frequency-modulated continuous-wave (FMCW) radar system for distance and/or velocity measurement according to one or more embodiments.

FIG. 1 is a schematic diagram illustrating a frequency-modulated continuous-wave (FMCW) radar system with a radar device 1 (radar transceiver) and a radar target T that is located in the radar channel within the measurement range of the radar device. In the present example, separate transmit (TX) and receive (RX) antennas 5 and 6, respectively, are used (bistatic or pseudo-monostatic radar configuration). However, it is noted that a single antenna can be used so that the receive antenna and the transmit antenna are physically the same (monostatic radar configuration). The transmit antenna continuously radiates an RF signal $s_{RF}(t)$, which is frequency-modulated, for example, by a saw-tooth signal (periodic linear ramp signal, see also FIG. 2). The transmitted signal $s_{RF}(t)$ is back-scattered at a target T, which is located in the radar channel, and the back-scattered signal $y_{RF}(t)$ is received by the receive antenna 6. The back-scattered signal is denoted as $y_{RF}(t)$. It is noted that antenna arrays may be used instead of single antennas, for example, to specifically tune the radiation pattern of the radar device (beam forming).

Figure 2:
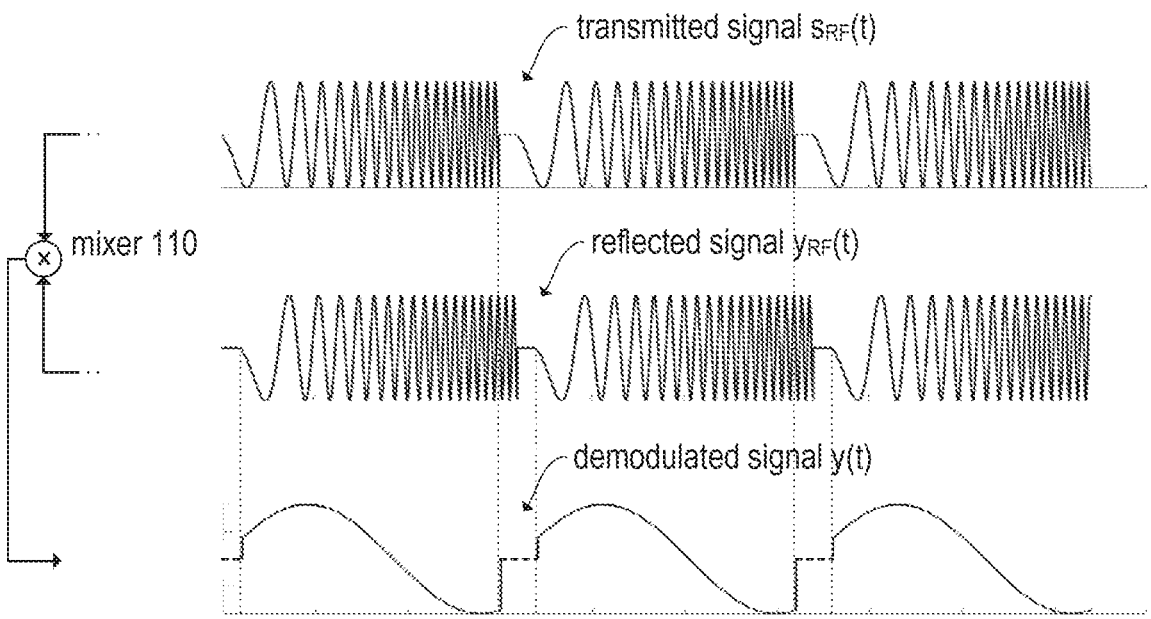
FIG. 2 includes timing diagrams illustrating the frequency modulation and demodulation of a radio frequency (RF) signal used in FMCW radar systems according to one or more embodiments.

In the radar transceiver 1, the received RF signal $y_{RF}(t)$ is demodulated by mixing the signal $y_{RF}(t)$ with a copy of the transmitted RF signal $s_{RF}(t)$ (reference signal) to effect a down-conversion of the signal $y_{RF}(t)$ into the base band. This down-conversion is illustrated in FIG. 2. The received RF signal $y_{RF}(t)$ lags behind the transmitted RF signal $s_{RF}(t)$ due to the time (round trip delay time, RTDT) which the radiated signal needs to travel to the target T and back to the radar device 1. As a consequence, there is a frequency difference between the received RF signal $y_{RF}(t)$ and the reference signal. When the two signals $s_{RF}(t)$ and $y_{RF}(t)$ are mixed (i.e. demodulated), a demodulated signal y(t) of (almost) constant frequency (in case of a linear frequency modulation) is obtained (also referred to as beat frequency). The beat frequency of the received and demodulated signal y(t) can be determined (e.g., using Fourier analysis) and used to calculate the distance between the radar device 100 and the target T. A signal-processing scheme called "Range-Doppler Processing" of the demodulated radar signal in the digital domain may be used to calculate so-called two-dimensional Range-Doppler Maps, which can be used to determine both, the distance of the target as well as its velocity. However, Range-Doppler Processing of FMCW radar signals is as such known and therefore not discussed herein in more detail.

As shown in the first timing diagram of FIG. 2, the signal $s_{RF}(t)$ may be composed of a series of "chirps", i.e. a sinusoidal waveform with increasing (up-chirp) or decreasing (down-chirp) frequency. In the present example, the instantaneous frequency f(t) of a chirp increases linearly from a start frequency $f_0$ to a stop frequency $f_1$ within a defined time span $T_R$ (chirp duration). Such a chirp is also referred to as a linear frequency ramp. Three identical linear frequency ramps are illustrated in FIG. 2. It is noted, however, that the parameters $f_0$, $f_1$, $T_R$ as well as the pause between the individual frequency ramps may vary dependent on the actual implementation and use of the radar transceiver 1. In practice, the frequency variation may be, for example, linear (linear chirp, frequency ramp), exponential (exponential chirp) or hyperbolic (hyperbolic chirp).

Figure 3:
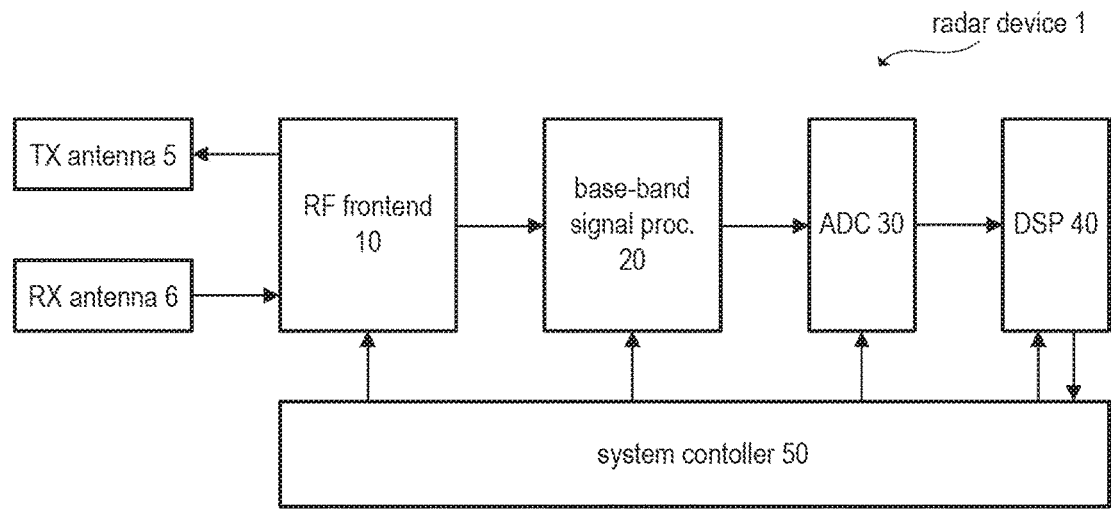
FIG. 3 is a block diagram illustrating the basic structure of an FMCW radar device according to one or more embodiments.

FIG. 3 is a block diagram that illustrates an exemplary structure of a radar transceiver 1 (radar sensor). Accordingly, at least one transmit antenna 5 (TX antenna) and at least one receive antenna 6 (RX antenna) are connected to an RF front-end 10, which may be integrated in a monolithic microwave integrated circuit (MMIC). The RF front-end 10 may include all the circuit components needed for RF signal processing. Such circuit components may include, for example, a local oscillator (LO), RF power amplifiers, low noise amplifiers (LNAs), directional couplers such as rat-race-couplers and circulators, and mixers for the down-conversion of RF signals (e.g., the received signal $y_{RF}(t)$, see FIG. 1) into the base band or the IF-band. As mentioned, antenna-arrays may be used instead of single antennas. The depicted example shows a bistatic (or pseudo-monostatic) radar system, which has separate RX and TX antennas. In case of a monostatic radar system, a single antenna or a single antenna array may be used for both, receiving and transmitting electromagnetic (radar) signals. In this case, a directional coupler may be used to separate RF signals to be transmitted to the radar channel from RF signals (radar signals) received from the radar channel. Various types of directional couplers may be used, for example, coupled transmission lines, a rat-race coupler, a branch-line coupler, a Lange coupler, a circulator, etc.

In a frequency-modulated continuous-wave (FMCW) radar system, the transmitted RF signals radiated by the TX antenna 5 are usually in the range between approximately 20 GHz (e.g., 24 GHz) and 81 GHz (e.g., 77 GHz in automotive applications). However, other frequency ranges may be used. As mentioned, the RF signal received by the RX antenna 6 includes the radar echoes, i.e. the signal back-scattered at the so-called radar targets. The received RF signal $y_{RF}(t)$ is down-converted into the base band (sometimes referred to as intermediate frequency (IF) band) and further processed in the base band using analog signal processing (see FIG. 3, base band signal processing chain 20), which basically includes filtering and amplification of the base band signal. The base band signal is finally digitized using one or more ADCs 30 and further processed in the digital domain (see FIG. 3, digital signal processing chain implemented, e.g., in digital signal processor 40). The overall system is controlled by a system controller 50, which may be at least partly implemented using a processor such as a microcontroller executing appropriate firmware. The RF front-end 10 and the analog base band signal processing chain 20 (and optionally the ADC 30) may be integrated in a single MMIC. However, the components may be distributed among two or more integrated circuits.

Figure 4:
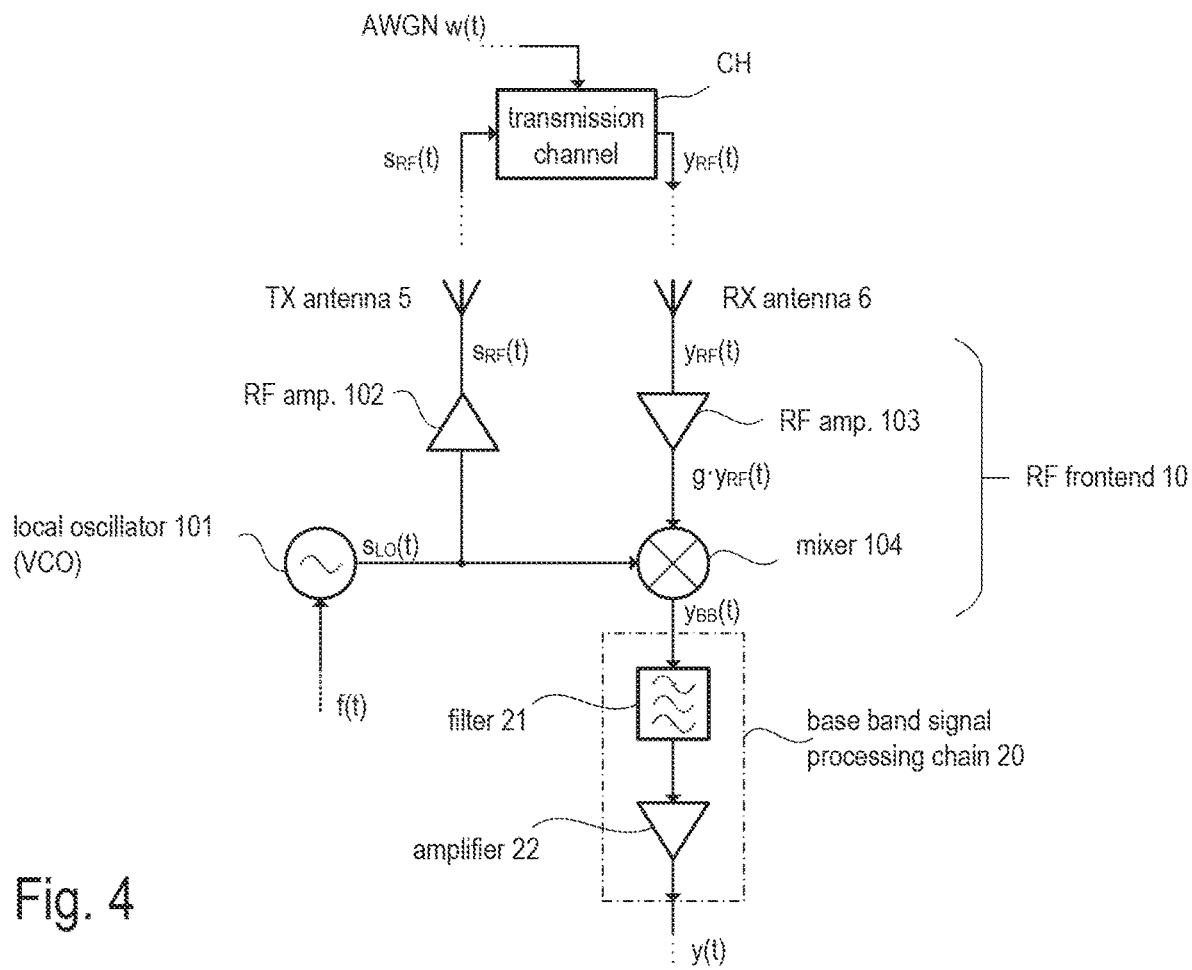
FIG. 4 is a circuit diagram illustrating one example of an analog RF front-end, which may be included in the FMCW radar device of FIG. 3, according to one or more embodiments.

FIG. 4 illustrates one exemplary implementation of the RF front-end 10, which may be included in the radar sensor shown in FIG. 3. It is noted that FIG. 4 is a simplified circuit diagram illustrating the basic structure of an RF front-end. Actual implementations, which may heavily depend on the application, are of course more complex. The RF front-end 10 includes a local oscillator 101 (LO) that generates an RF signal $s_{LO}(t)$, which may be frequency-modulated as explained above with reference to FIG. 2. The signal $s_{LO}(t)$ is also referred to as LO signal). In radar applications, the LO signal is usually in the SHF (Super High Frequency) or the EHF (Extremely High Frequency) band, e.g., between 76 GHz and 81 GHz in automotive applications.

The LO signal $s_{LO}(t)$ is processed in the transmit signal path as well as in the receive signal path. The transmit signal $s_{RF}(t)$, which is radiated by the TX antenna 5, is generated by amplifying the LO signal $s_{LO}(t)$, e.g., using an RF power amplifier 102. The output of the amplifier 102 is coupled to the TX antenna 5. The transmission channel (i.e. the electromagnetic transmission path), in which the radar targets are located and in which the radar signal is superimposed with noise w(t) (e.g., arbitrary white Gaussian noise, AWGN), is also illustrated in FIG. 4 as a separate block labelled CH. The received signal $y_{RF}(t)$, which is received by the RX antenna 6, is provided to a mixer 104 for the mentioned down-conversion into the base band.

In the present example, the received signal $y_{RF}(t)$ (i.e. the antenna signal) is pre-amplified by RF amplifier 103 (gain g), so that the mixer receives the amplified signal $g \cdot y_{RF}(t)$ at its RF input. The amplifier 103 may be an LNA (low noise amplifier). The mixer 104 further receives the LO signal $s_{LO}(t)$ at its reference input and is configured to down-convert the amplified radar signal $g \cdot y_{RF}(t)$ into the base band. The resulting base band signal at the mixer output is denoted as $y_{BB}(t)$. The base band signal $y_{BB}(t)$ is further processed by the analog base band signal processing chain 20 (see also FIG. 3), which basically includes one or more filters (e.g., a band-pass 21) to remove undesired side bands and image frequencies as well as one or more amplifiers such as amplifier 22). The analog output signal, which may be supplied to an analog-to-digital converter (cf. FIG. 3) is denoted as y(t).

In the present example, the mixer 104 down-converts the RF signal $g \cdot y_{RF}(t)$ (amplified antenna signal) into the base band. The respective base band signal (mixer output signal) is denoted by $y_{BB}(t)$. The down-conversion may be accomplished in a single stage (i.e. from the RF band into the base band) or via one or more intermediate stages (from the RF band into an IF band and subsequently into the base band). The base band or IF-band signal y(t) may be digitized (see FIG. 3, ADC 30) and further processed in the digital domain (see FIG. 3, DSP 40).

Figure 5:
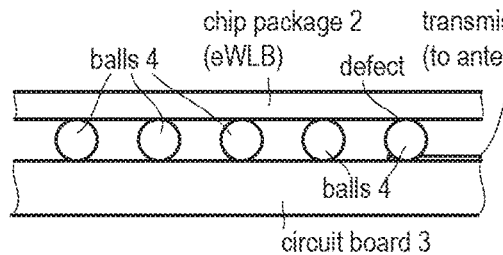
FIGS. 5(a) and 5(b) illustrate two schematic diagrams that show defective solder connections between the packaged monolithic microwave integrated circuit (MMIC) and a circuit board.
Figure 5:
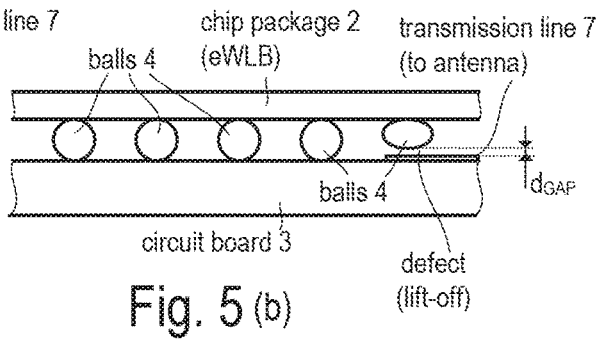

FIG. 5 includes two schematic diagrams (a) and (b) each illustrating a circuit board 3 of the radar device with the MMIC attached to the circuit board 3. In the present example, the MMIC is packaged in a chip package that is referred to as an enhanced Wafer Level Ball Grid Array (eWLB) package, which is common for radar applications. However, other types of packages may be used. The individual balls 4 of the Ball Grid Array connect, inter alia, the RF front-end 10 integrated in the MMIC with other components attached to or connected to the circuit board 3. In the present example, transmission line (e.g., a strip line) 7 formed on the circuit board 3 may connect the MMIC with an antenna. In the example depicted in diagram (a), one of the solder connections between chip package 2 and circuit board 3 is defective due to a defective connection between a chip contact and the respective solder ball 4, which can result in undesired reflections of RF signals and deteriorated impedance matching. Similarly, the example depicted in diagram (b) illustrates a defect due to a deformed ball which has broken loose leaving a gap $d_{GAP}$ between solder ball 4 and transmission line 7. However, it is understood that a defect is not limited to mechanical defects of the contact between chip package 2 and transmission line(s) 7 or mechanical defects of the transmission lines(s). Accordingly, any effect causing a change or deterioration of the impedance or the characteristics of the transmission line may be regarded as defect.

Radar applications used in automobiles are subject to various standards concerning road traffic safety, for example, the functional safety standard ISO 26262 titled "Road vehicles—Functional safety". To improve functional safety of a radar sensor, a radar device may include monitoring and self-test functions. Accordingly, monitoring and self-test circuits may be included in the MMIC and configured to check whether the measured distance and velocity values are reliable. In the exemplary embodiments described below the RF front-end is enhanced by a monitoring circuit, which may be used to detect defects in the signal path externally connected to the RF output port, to which the TX antenna 5 is connected (TX antenna port). However, in other applications, a similar monitoring circuit may be used to detect defects in the signal path connected to other RF ports (different from the TX antenna port). Accordingly, the present description is not limited to the monitoring and testing of the TX antenna ports of a radar sensor. In this regard, any physical cause affecting the reflection/transmission coefficients or the impedance matching (or both) at an RF output port of the RF front-end is regarded as a "defect" in the signal path connected to the RF output port. Such a defect may be caused by a defective solder ("solder joint break") connection between chip package 2 of the MMIC and the circuit board 2 (see FIG. 5). Further, the transmission line between the chip package 2 and the external antenna 5 may be broken ("wire break"), or the connection between a ball 4 of the chip package 2 and the MMIC may be defective ("ball break"), which would also give rise to a defect.

Figure 6:
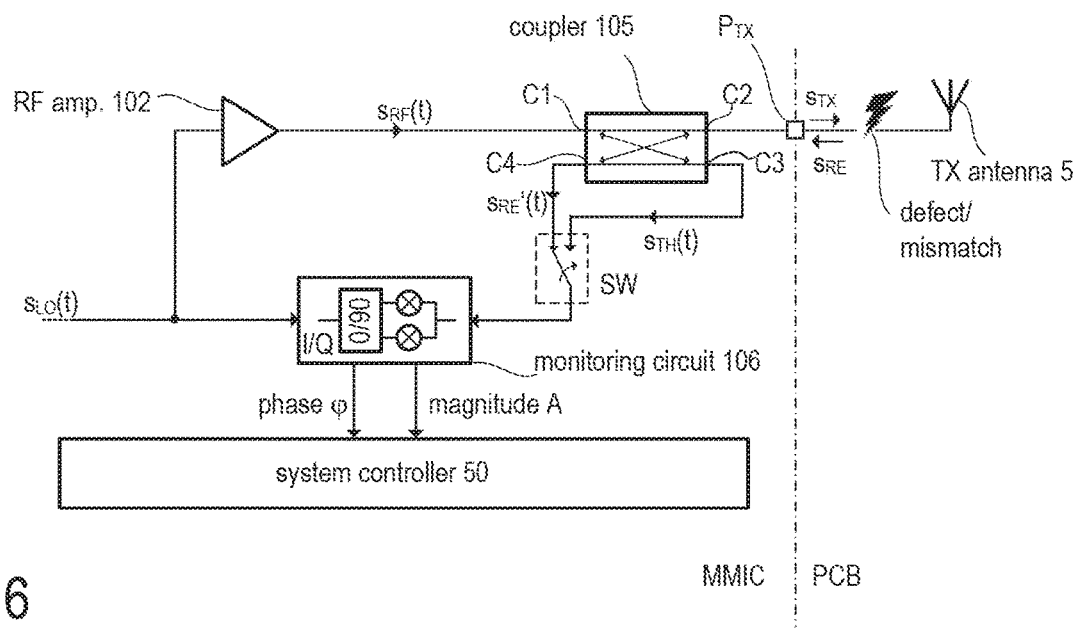
FIG. 6 is a block diagram illustrating one example of an RF transmit signal path of a radar transceiver with additional circuit components, which may be used to detect a defect (e.g., imperfections, degradation over time, etc.) in the RF signal path (e.g., to an antenna) or a deteriorated matching at the RF port (e.g., antenna port) according to one or more embodiments.

FIG. 6 is a circuit diagram illustrating only the transmit path of the RF front-end 10 (see FIG. 4) with an additional monitoring circuit 106 configured to detect a defect in the signal path externally connected to an RF output port $P_{TX}$ (e.g., antenna port). The monitoring circuit 106 may be coupled to the RF output port $P_{TX}$ by a directional coupler 105. That is, directional coupler 105 is connected between the port $P_{TX}$ and the power amplifier 102 and is configured to feed through a first portion (signal $s_{TX}(t)$) of the amplifier output signal $s_{RF}(t)$ to the RF output port $P_{TX}$ (and thus to the antenna 5) and to direct a second portion (signal $s_{TH}(t)$) of the amplifier output signal $s_{RF}(t)$—via RF switch SW—to the monitoring circuit 106. The reflected signal $s_{RE}(t)$ incident at the RF output port $P_{TX}$ includes all undesired reflections in the signal path externally connected to the RF output port $P_{TX}$. As mentioned, these undesired reflections may be caused by various defects including an imperfect impedance matching at the antenna port, at which the antenna impedance should match with the output impedance of the RF front-end. The directional coupler 105 is also configured to direct—via RF switch SW—a portion (signal $s_{RE}'(t)$) of the reflected signal $s_{RE}(t)$ to the monitoring circuit 106. Accordingly, dependent on the position of the switch SW, the monitoring circuit 106 receives either the portion $s_{TH}(t)$ of the transmit signal $s_{RF}(t)$ or the portion $s_{RE}'(t)$ of the reflected signal $s_{RE}(t)$. In this regard the expression "a portion of a signal" means "a portion of the signal power". Accordingly, signal $s_{TH}(t)$ is basically the same as signal $s_{RF}(t)$ but has only a fraction of the signal power of the signal $s_{RF}(t)$. Similarly, signal $s_{RE}'(t)$ is basically the same as signal $s_{RE}(t)$ but has only a fraction of the signal power of the signal $s_{RE}(t)$.

It is noted that the RF switch SW may be implemented in various ways and does not necessarily imply a direct switching of the transmission lines as shown in FIG. 6. Practically any circuitry providing the same or a similar effect may be used to implement an RF switch. For example, the signal transmission through one transmission line (e.g., the transmission line carrying the signal $s_{RE}'(t)$) may be deactivated by connecting the transmission line to ground potential, while the other transmission line (e.g., the transmission line carrying the signal $s_{TH}(t)$) is disconnected from ground potential or vice versa. The monitoring circuit 106 may be implemented as a demodulator, e.g., an IQ demodulator, which demodulates the signal $s_{TH}(t)$ or the signal $s_{RE}'(t)$ using the local oscillator signal $s_{LO}(t)$ for demodulation. As a result of the demodulation, the phase φ and the amplitude A of signal $s_{TH}(t)$ or signal $s_{RE}'(t)$ with respect to the local oscillator signal $s_{LO}(t)$ are obtained. Accordingly, the monitoring 106 may work similar to a lock-in amplifier.

In other words, the monitoring circuit 106 further receives, as reference signal, the LO signal $s_{LO}(t)$ and uses this reference signal to down-convert (demodulate) the input signal (i.e. signal $s_{TH}(t)$ or $s_{RE}'(t)$ dependent on the switch position of RF switch SW) into the base band and subsequently determine magnitude and phase of the input signal. The monitoring circuit 106 may be used to monitor the reflections occurring in the signal path outside the MMIC, e.g., in the signal path from the output port $P_{TX}$ to the antenna. This monitoring of the reflections may be used to detect various external defects, i.e. defects outside the MMIC such as defects in the signal path from the output port $P_{TX}$ to the antenna.

Figure 7:
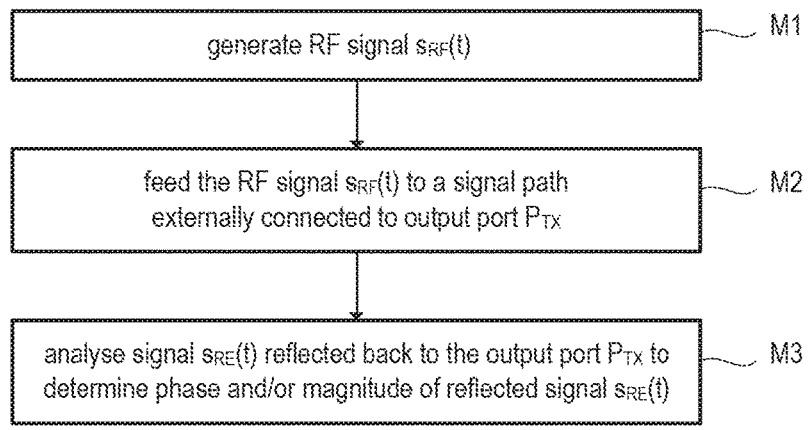
FIG. 7 is a flow chart illustrating one exemplary approach for detecting external defects (defects outside the MMIC) in the signal path between an RF output port and the antenna according to one or more embodiments.

FIG. 7 is a flow chart illustrating one exemplary approach for detecting external defects (defects outside the MMIC) in the signal path coupled to an RF output port of the MMIC. According to this approach, the monitoring circuit 106 and the directional coupler 105 of the RF front-end of a radar sensor may be used to implement the method illustrated in FIG. 7. Accordingly, an RF signal $s_{RF}(t)$ is generated (see FIG. 7, step M1), e.g., by a local oscillator (LO, see FIG. 4, LO 101). The (e.g., amplified) RF signal $s_{RF}(t)$ is fed to a signal path externally connected to output port $P_{TX}$ (see FIG. 7, step M2), e.g., to the signal path from output port $P_{TX}$ to TX antenna 5. As mentioned, reflections may occur in this signal path for various reasons. Even if the antenna impedance and the output impedance of the output port $P_{TX}$ match, the reflections will not be zero as, in practice, the impedance matching will never be perfect. In fact, in practical implementations up to one third of the signal power of the RF signal $S_{RF}(t)$ output at the output port $P_{TX}$ may be reflected back towards the output port $P_{TX}$. The reflected signal $s_{RE}(t)$ is analyzed to determine phase φ or magnitude A (or both) of reflected signal $s_{RE}(t)$ (see, FIG. 7, step M3). It is understood that determining the signal power is practically equivalent to determining the signal magnitude as the signal power is proportional to the squared magnitude $A^2$.

Figure 8:
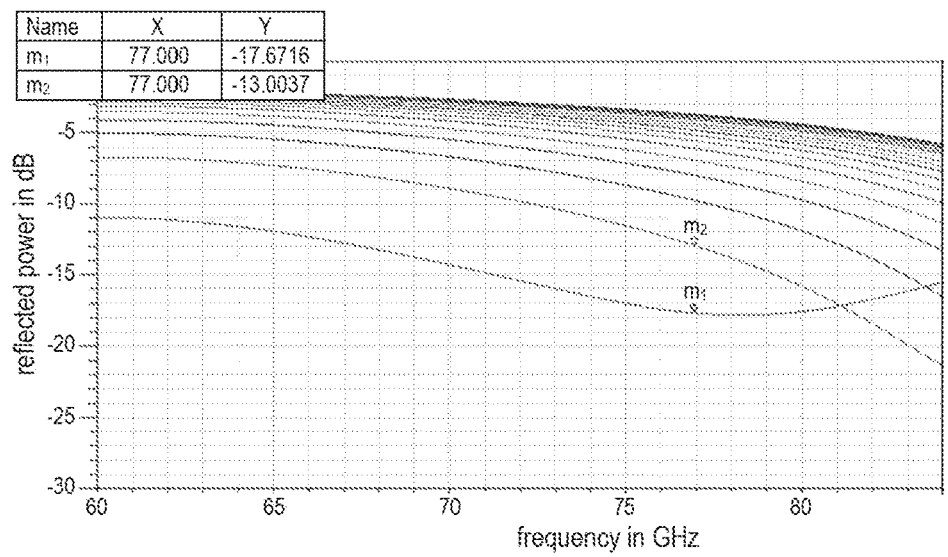
FIG. 8 is a diagram illustrating the signal power of the signal reflected back to the RF output port due to a defective (e.g., imperfect or degraded) solder ball of the chip package.

Although some reflections may always be present, the reflected power will increase in the case of a defect in the signal path externally coupled to the RF output port $P_{TX}$. FIG. 8 is a diagram illustrating the signal power of the signal $s_{RE}(t)$ reflected back to the RF output port $P_{TX}$ due to a defective solder ball of the chip package (see, e.g., FIG. 5, Diagram b). In FIG. 8, the lower curve, labelled "m1" represents the scattering parameter (S-parameter) $S_{11}$ (i.e. the reflected power, which is incident at output port $P_{TX}$, in decibel) for an external signal path without any defects. One can see that, according to curve "m1", the reflected signal power at a frequency of approximately 77 GHz is approximately −18 dB. The curve, labelled "m2" represents the S-parameter $S_{11}$ for an external signal path, in which the ball of the chip package (e.g., eWLB package) is about to break and exhibits a crack with a width of 10 μm. One can see that, according to curve "m2", the reflected signal power at a frequency of approximately 77 GHz has increased by 5 dB to approximately −13 dB. The further curves (from bottom to top) illustrate the S-parameters $S_{11}$ for an external signal path, in which the ball of the chip package (e.g., eWLB package) exhibits a crack with a width of 20, 30, 40, 50, 60 μm, etc. One can see that the reflected power further increases as the crack in the ball becomes wider.

It is understood that the above-described defect (crack in a ball of the chip package) is merely one illustrative example, and similar defects like a crack in the strip line between the ball of the chip package and the antenna may have a similar effect. Any defect in the signal path coupled to the output port $P_{TX}$ may give rise to an increase of the reflected signal power. For example, the strip-line between the output port $P_{TX}$ and the antenna may have a crack that causes reflections. Additionally, when evaluating the phase of the reflected signal $s_{RE}(t)$ the position of the defect may be localized. For example, by evaluating the phase a defect at or close to the chip package (e.g., a ball break) may be discerned from a defect at or close to the antenna (i.e. distant from the chip package).

Figure 9:
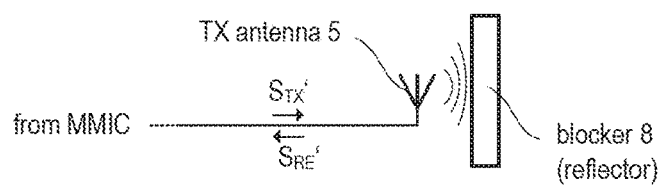
FIG. 9 illustrates how a blocker (reflecting obstacle) close to the antenna deteriorates the reflection coefficient at the antenna port.

FIG. 9 illustrates another situation, in which the signal amplitude and power of the reflected signal $s_{RE}(t)$ may be increased. FIG. 9 illustrates the TX antenna 5 and a "blocker" 8, which obstructs radiation away from the antenna 5 and caused a reflection/back-scattering of the radiated signal. The blocker 8 may be any object close to the antenna 5 which inhibits (i.e. at least partly blocks) radiation from the antenna 5 and causes reflection/back-scattering of the radiated signal. In automobile applications in which the radar sensors may be mounted behind the bumpers, snow and ice may be blockers. As the radiation reflected/back-scattered by the blocker 8 may be received by the TX antenna 5, the blocker 8 may also give rise to an increase of the reflected signal power, which may be detected by the monitoring circuit 106 in the same way as a ball break (see, e.g., FIG. 5) or a line break. By evaluating the phase of the reflected signal $s_{RE}'(t)$, reflections caused by a blocker may be discerned from reflections caused by a solder ball break or a line break.

According to the method of FIG. 7, only magnitude and/or phase of the reflected signal $s_{RE}(t)$ (or the portion $s_{RE}'(t)$ to be precise) is determined to detect defects. In this case, an evaluation of the signal $s_{TH}(t)$ provided by the directional coupler 105 and representing the transmitted signal $s_{TX}(t)$ is not needed. Accordingly, the switch SW may be omitted and the port of the coupler 105, at which the signal $s_{TH}(t)$ is provided, may be terminated using a suitable termination impedance. However, in some applications it may be desirable to not only know the reflected signal power (or magnitude) but rather the ratio between reflected signal power (power of signal $s_{RE}(t)$) and transmitted signal power (power of signal $s_{RF}(t)$). Furthermore, the phase difference (instead of a single phase) between transmitted signal $s_{RF}(t)$ and reflected signal $s_{RE}(t)$ may be desired to localize a defect. Therefore, in one exemplary embodiment the phases and the magnitudes of the signals $s_{TH}(t)$ and $s_{RE}'(t)$ are subsequently determined by monitoring circuit 106, wherein switch SW is used to subsequently direct the signals $s_{TH}(t)$ and $s_{RE}'(t)$ to the monitoring circuit 106. It is understood that the phases and the magnitudes of the signals $s_{TH}(t)$ and $s_{RE}'(t)$ represent the phases and the magnitudes of the signals $s_{RF}(t)$ and $s_{RE}(t)$. That is, $$\Delta\varphi \sim \text{phase}\{s_{RE}(t)\} - \text{phase}\{s_{RF}(t)\} \sim \text{phase}\{s'_{RE}(t)\} - \text{phase}\{s_{TH}(t)\}, \text{ and}$$

$$S_{11} \sim \text{mag}\{s_{RE}(t)\}^2 / \text{mag}\{s_{RF}(t)\}^2 \sim \text{mag}\{s_{RE}'(t)\}^2 / \text{mag}\{s_{TH}(t)\}^2.$$

wherein the phase{•} and mag{•} represent signal phase and magnitude (e.g., in V/√Ω), respectively (the squared magnitude is proportional to the signal power). $\Delta\varphi$ denotes the phase difference between transmitted and reflected signal and $S_{11}$ is the S-parameter representing the reflection coefficient (see FIG. 8).

Figure 10:
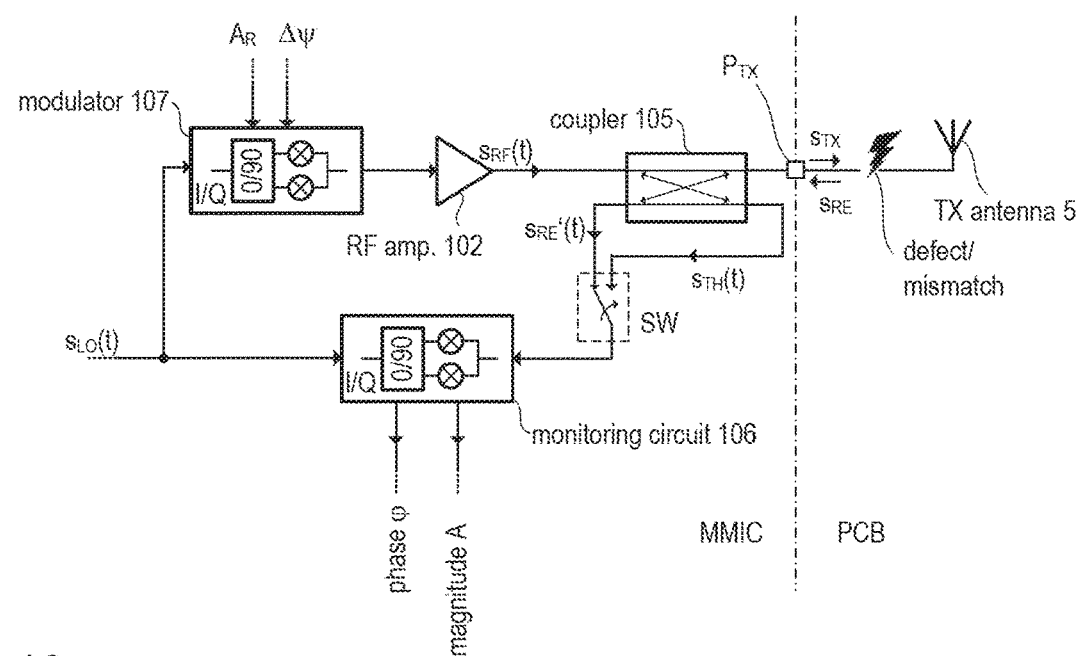
FIG. 10 is a block diagram illustrating one example of an RF transmit signal path of a radar transceiver similar to the example of FIG. 5 but with additional circuit components to tune a phase of the RF output signal according to one or more embodiments.

Apart from the detection of defects, the monitoring circuit 106 may also be used to tune the signal phase of the RF signal $s_{RF}(t)$ at RF output port $P_{TX}$. FIG. 10 is a block diagram illustrating one example of a RF transmit signal path of a radar transceiver similar to the example of FIG. 5 but with additional circuit components for tuning the phase of the RF output signal $s_{RF}(t)$. Basically, the example of FIG. 10 is the same as the previous example of FIG. 5 but with an additional modulator 107 coupled to the RF power amplifier 102 upstream thereof. The modulator 107 may be an IQ modulator and configured to adjust (tune) amplitude and phase of the input signal of the amplifier 102 and thus also the phase of the output signal $s_{TX}(t)$ at the RF output port $P_{TX}$. In the example depicted in FIG. 10, the modulator 107 receives input signals representing a phase shift $\Delta\psi$ and an amplitude gain $A_R$. As mentioned, the modulator 107 may be an IQ modulator which may be constructed similarly to the IQ demodulator used in the monitoring unit 106.

Figure 11:
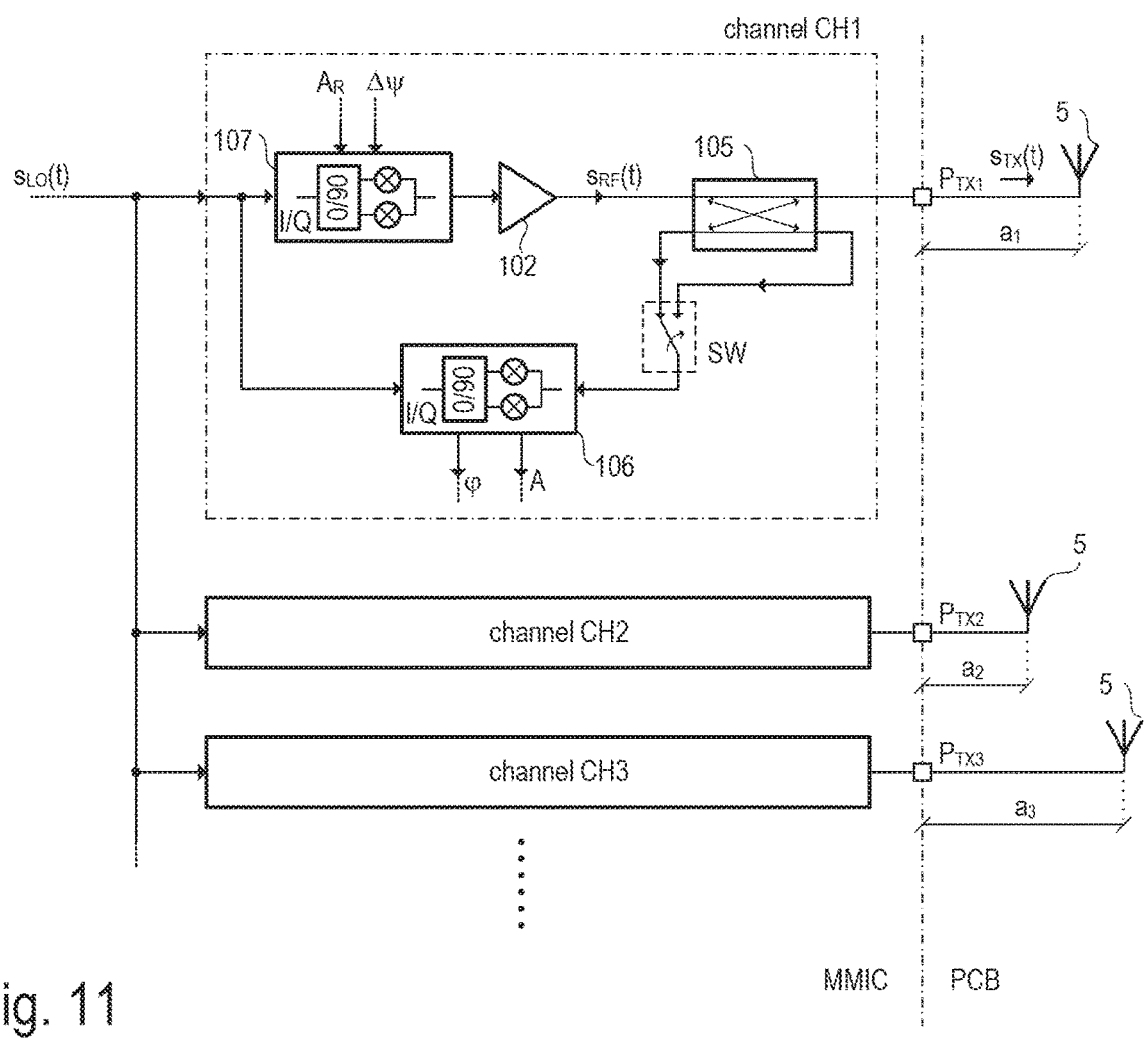
FIG. 11 illustrates a radar transceiver with multiple output channels according to one or more embodiments.

Tuning amplitude and phase of the RF output signal $s_{RF}(t)$ may be particularly useful in applications with multiple output channels and multiple antennas, which may be arranged in an antenna array, e.g., to enable beam forming (tuning of the radiation pattern of the antenna array). In current (multiple input/multiple output, MIMO) systems, the phase of the RF output signal $s_{TX}(t)$ is basically determined by the length of the transmission lines from the output port $P_{TX}$ to the connected antenna 5. This fact may impose some undesired boundary conditions onto the design of the circuit board on which the transmission lines are arranged. The example of FIG. 11 illustrates a radar transceiver with multiple output channels CH1, CH2, CH3, etc., wherein each channel includes a modulator 107 and a monitoring circuit 106 as illustrated in the example of FIG. 10. The RF output ports of the channels $P_{TX1}$, $P_{TX2}$, $P_{TX3}$, etc., wherein the length of the transmission line to the respective TX antenna 5 is $a_1$ for channel CH1, $a_2$ for channel CH1, and $a_3$ for channel CH3. To compensate for the phase differences at the position of the antennas of the different channels, the modulators 107 included in the channels may be used to tune the phases of the respective RF output signals so that the phases of the RF signals arriving at the antennas 5 match. That is, the phases of the RF signals arriving at the antennas 5 are the same.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising"

What is claimed is:

1. A radar front-end circuit of a radar transceiver, the circuit comprising:
   a local oscillator (LO) configured to generate a radio frequency (RF) radar signal;
   a first transmit channel comprising a first RF output port coupled to the local oscillator;
   a first IQ modulator coupled to the local oscillator to receive the RF radar signal and configured to tune a phase of the RF radar signal to generate a first phase tuned RF radar signal;
   a first RF amplifier coupled to the first IQ modulator to receive the first phase tuned RF radar signal and configured to provide a first amplified RF radar signal as a first RF radar transmit signal;
   a first monitoring circuit configured to receive a first input signal and configured to determine at least one of a phase of the first input signal or a power of the first input signal;

a first directional coupler coupled to the first RF output port and configured to direct a first reflected signal incoming at the first RF output port as the first input signal to the first monitoring circuit, wherein the first directional coupler is coupled between an output of the first RF amplifier and the first RF output port and is configured to direct the first amplified RF radar signal to the first RF output port; and a controller configured to detect, based on the at least one determined phase or determined power of the first input signal, a first defect in a first signal path operably connected to the first RF output port, wherein the controller is configured to tune a phase of the first RF radar transmit signal to match with a phase of a second RF radar transmit signal of a second transmit channel.

2. The radar front-end circuit of claim 1, wherein the controller is configured to provide a first phase shift to the first IQ modulator used to tune the phase of the RF radar signal to generate the first phase tuned RF radar signal such that the phase of the first RF radar transmit signal matches with the phase of the second RF radar transmit signal of the second transmit channel.

3. The radar front-end circuit of claim 2, wherein the controller is configured to provide a first amplitude gain to the first IQ modulator used to tune an amplitude of the RF radar signal to generate the first phase tuned RF radar signal.

4. The radar front-end circuit of claim 1, further comprising:
the second transmit channel comprising a second RF output port coupled to the local oscillator;
a second IQ modulator coupled to the local oscillator to receive the RF radar signal and configured to tune a phase of the RF radar signal to generate a second phase tuned RF radar signal; and
a second RF amplifier coupled to the second IQ modulator to receive the second phase tuned RF radar signal and configured to provide a second amplified RF radar signal as the second RF radar transmit signal,
wherein the controller is configured to tune the phase of at least one of the first RF radar transmit signal and the second RF radar transmit signal such that the phase of the first RF radar transmit signal matches the phase of the second RF radar transmit signal.

5. The radar front-end circuit of claim 4, wherein the controller is configured to provide a second phase shift to the second IQ modulator to tune the phase of the RF radar signal to generate the second phase tuned RF radar signal such that the phase of the second RF radar transmit signal matches with the phase of the first RF radar transmit signal.

6. The radar front-end circuit of claim 4, further comprising:
a second monitoring circuit configured to receive a second input signal and configured to determine at least one of a phase of the second input signal or a power of the second input signal;
a second directional coupler coupled to the second RF output port and configured to direct a second reflected signal incoming at the second RF output port as the second input signal to the second monitoring circuit, wherein the second directional coupler is coupled between an output of the second RF amplifier and the second RF output port and is configured to direct the second amplified RF radar signal to the second RF output port,
wherein the controller is configured to detect, based on the at least one determined phase or determined power of the second input signal, a second defect in a second signal path operably connected to the second RF output port.

7. The radar front-end circuit of claim 1, wherein the controller is further configured to localize the detected first defect based on the at least one determined phase or determined power of the first input signal such that the controller determines a position of the first defect on the first signal path external to the RF output port.

8. The radar front-end circuit of claim 1, wherein the controller is further configured to identify a type of defect of the detected first defect based on the at least one determined phase or determined power of the first input signal.

9. The radar front-end circuit of claim 8, wherein the type of defect is one of a ball break, a wire break, a solder joint break, an antenna break, or radar signal blocker.

10. The radar front-end circuit of claim 1, wherein the first monitoring circuit includes a mixer.

11. The radar front-end circuit of claim 1, wherein the first monitoring circuit includes a further IQ-modulator configured to determine a magnitude and the phase of the first input signal.

12. The radar front-end circuit of claim 1, wherein:
the first directional coupler is configured to receive the first amplified RF radar signal at a first coupler port and is configured to direct the first amplified RF radar signal to a second coupler port, which is connected to the first RF output port, as well as to a third coupler port,
the first directional coupler is configured to direct the first reflected signal from the second coupler port to a fourth coupler port, and
the radar front-end circuit further comprises an RF switch coupled to the first directional coupler and configured to connect, dependent on a switch position, either the third coupler port or the fourth coupler port to the first monitoring circuit.

13. The radar front-end circuit of claim 1, further comprising:
an RF switch coupled to the first directional coupler,
wherein the RF switch is configured to forward, dependent on a switch position, either the first reflected signal or the first RF radar transmit signal from the first directional coupler to the first monitoring circuit.

14. The radar front-end circuit of claim 1, wherein the controller is configured to detect the first defect in the first signal path operably connected to the first RF output port upon detection that at least one of the determined power or determined phase of the first input signal has changed relative to a previous input signal.

15. The RF front-end circuit of claim 1, wherein the controller is configured to detect the first defect in the first signal path operably connected to the first RF output port by calculating a reflection coefficient of the first reflected signal and detecting whether the reflection coefficient has changed relative to a reflection coefficient of a previous input signal.

16. A self-test method for a radar front-end integrated in a monolithic microwave integrated circuit (MMIC), the method comprises:
generating phase tuned radio frequency (RF) radar signal from an RF radar signal;
generating an amplified RF radar signal as a first RF radar transmit signal from the phase tuned RF radar signal;
feeding the first RF radar transmit signal to a signal path of a first transmit channel, the signal path being operably connected to an RF output port of the MMIC;

analyzing a reflected signal, which is reflected back to the RF output port of the MMIC, to determine at least one of a phase of the reflected signal or a power of the reflected signal; and tuning a phase of the first RF radar transmit signal to match with a phase of a second RF radar transmit signal of a second transmit channel.

17. The method of claim 16, wherein analyzing the reflected signal comprises:

detecting a defect in the signal path operably connected to the RF output port based on at least one of the determined power or the determined phase of the reflected signal.

18. The method claim 17, wherein the defect is determined based on a detected change of at least one of the determined power or the determined phase of the reflected signal relative to a determined power or a determined phase of a previous reflected signal.

19. The method claim 16, wherein analyzing the reflected signal comprises:

detecting a defect in the signal path operably connected to the RF output port by calculating a reflection coefficient of the reflected signal and detecting a change of the reflection coefficient relative to a reflection coefficient of a previous reflected signal.

20. The method of claim 16, wherein analyzing the reflected signal comprises:

localizing the detected defect on the signal path external to the RF output port based on the at least one determined phase or determined power of the reflected signal.

\* \* \* \* \*